United States Patent
Arabi et al.

(10) Patent No.: US 6,777,970 B2
(45) Date of Patent: Aug. 17, 2004

(54) AC TESTING OF LEAKAGE CURRENT IN INTEGRATED CIRCUITS USING RC TIME CONSTANT

(75) Inventors: Tawfik R. Arabi, Tigard, OR (US); Gregory F. Taylor, Portland, OR (US); Srirama Pedarla, Portland, OR (US); Patrick Elwer, Hillsboro, OR (US); Dan Murray, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 174 days.

(21) Appl. No.: 09/838,730

(22) Filed: Apr. 19, 2001

(65) Prior Publication Data

US 2002/0153914 A1 Oct. 24, 2002

(51) Int. Cl.[7] .......................... G01R 31/26; G01R 31/28
(52) U.S. Cl. ....................................... 324/765; 714/727
(58) Field of Search ............................. 324/158.1, 765; 714/726, 727

(56) References Cited

U.S. PATENT DOCUMENTS

| | | | | | |
|---|---|---|---|---|---|
| 5,519,327 | A | * | 5/1996 | Consiglio | 324/678 |
| 5,523,699 | A | * | 6/1996 | Miyagawa | 324/765 |
| 6,255,842 | B1 | * | 7/2001 | Hashimoto | 324/765 |
| 6,342,790 | B1 | * | 1/2002 | Ferguson et al. | 324/765 |

* cited by examiner

Primary Examiner—David A. Zarneke
Assistant Examiner—Russell M Kobert
(74) Attorney, Agent, or Firm—Schwegman, Lundberg, Woessner & Kluth, P.A.

(57) ABSTRACT

A method of testing an integrated circuit includes applying a voltage to one of the pins of the integrated circuit. The pin is floated for a predetermined time. A measurement is performed after the predetermined time. The measurement involves sampling the RC time constant of leakage current of the pins.

28 Claims, 5 Drawing Sheets

AC TESTING OF LEAKAGE CURRENT IN INTEGRATED CIRCUITS USING RC TIME CONSTANT

TECHNICAL FIELD OF THE INVENTION

The present invention relates generally to testing integrated circuits, and in particular to leakage test of the inputs/outputs an integrated circuit.

BACKGROUND OF THE INVENTION

Testing integrated circuits (ICs) is a routine task to improve quality of the ICs and to ensure that they meet designed specifications. Testing can be done at different points during manufacturing of the ICs. A test can be applied to the pads of an IC when it is at the wafer level or to the pins of the IC after it is formed in a package.

Leakage test is one of many different types of testing an IC. In this test, conventionally, a tester or an automatic testing equipment (ATE) is connected to the pins of the IC. The tester applies a predetermined DC voltage to the pin being tested and measures the resulting DC current at the pin. The value of the measured current is compared against the expected value to determine the pass/fail test result of the pin.

Leakage test using the conventional method, however, is time consuming. In addition, every pin being tested must be connected to a tester port or channel. This requires the tester to have enough channels to accommodate the number of pins of the ICs. Since the cost of the tester is proportional to the number of the tester channels, it is expensive for per pin leakage test using the conventional method.

There is a need for a different method of leakage test, which requires less time and is cost effective.

DETAILED DESCRIPTION OF THE INVENTION

The following detailed description refers to the accompanying drawings which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
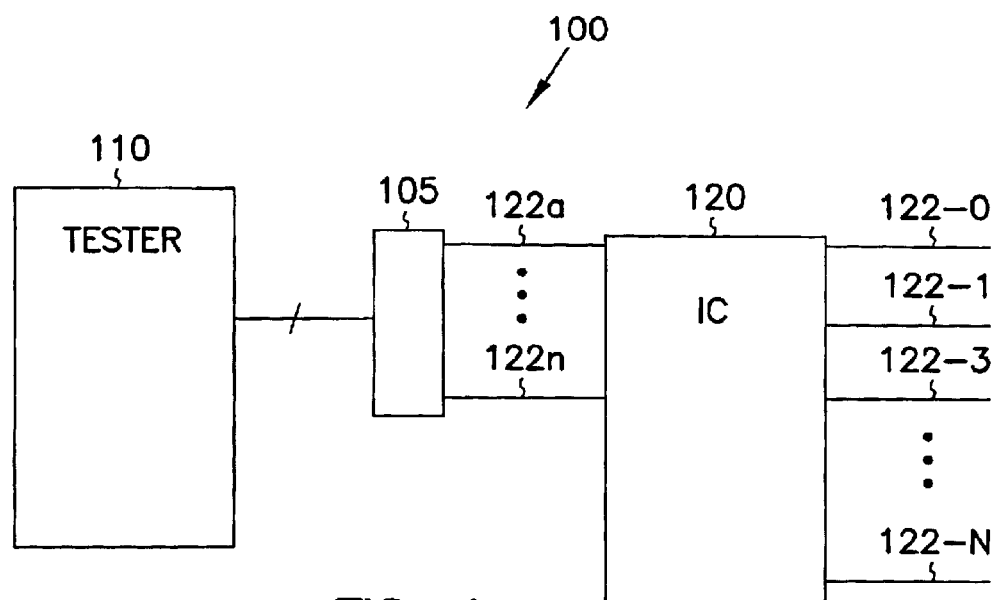
FIG. 1 is a block diagram of an environment in which the invention can be practiced.

FIG. 1 is a block diagram of an environment in which the invention can be practiced. Environment 100 includes a tester 110 and an IC 120. In one embodiment, tester 110 is a personal computer. IC 120 includes a plurality of functional terminals or pins 122-0, 122-1 through 122-N, and a plurality of Boundary Scan pins 122a–122n. IC 120 connects to tester 110 via Boundary Scan pins 122a–122n through an interface 105. Functional pins 122-0 through 122-N are used to perform all functions of IC 120 and also to provide utility functions such as supplying power to IC 120. The power includes, but is not limited to, a first supply voltage Vcc and a second supply voltage Vss. Boundary Scan pins 122a–122n are used to perform testing on IC 120 using a Boundary Scan test methodology.

Boundary Scan is also known as the IEEE 1149.1 standard, the IEEE std. 1149.1-1990, published Feb. 15, 1990 and its supplements including the IEEE std. 1149.1a-1993, published Jun. 17, 1993 and the IEEE std. 1149.1b-1994, published Sep. 22, 1994. The IEEE 1149.1 is a standard for testing integrated circuits and circuit boards. According to the IEEE 1149.1 standard, a Boundary Scan compliant IC has a number of Boundary Scan pins. These pins are used to access to the IC to test the functional pins such as input/output pins. IC 120 is a Boundary Scan compliant IC, thus pins 122-0 to 122-N can be tested by connecting Boundary Scan pins 122a–122n of IC 120 to tester 110.

In a Boundary Scan compliant IC, each functional pin such as pins 122-0 through 122-N connects to an internal boundary register cell. The cell is a single shift register and can be used as an input or output boundary register cell. Each cell is linked to another cell to form a boundary-scan register. When the boundary-scan register is selected, by applying Boundary Scan instructions to Boundary Scan pins such as pins 122a–122n, a state of a pin connected to the selected cell can be forced or determined.

Throughout the description of the invention, IC 120 represents a Boundary Scan compliant IC and the leakage test applied to IC 120 is through Boundary Scan. However, the leakage test according to the invention can also be equally applied to any IC, which is capable of giving control of pin driver/receivers to internal test circuitry of the IC or though external test pins such as pin 122a–122n.

Figure 2:
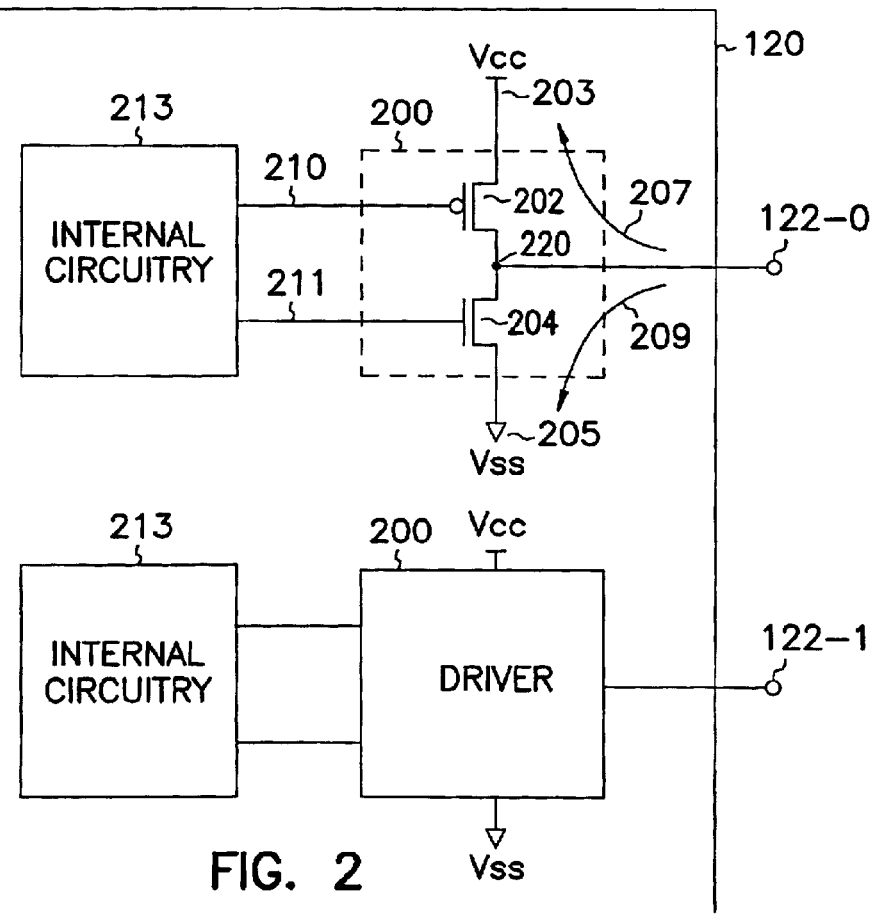
FIG. 2 is schematic diagram of a connection of a pin of an IC.

FIG. 2 is schematic diagram of pins 122-0 and 122-1 of an IC 120 of FIG. 1. Pin 122-0 connects to a buffer or driver 200. Driver 200 includes a p-channel transistor(s) 202 connected in series with an n-channel transistor(s) 204. Transistors 202 and 204 in driver 200 connect to the first and second supply voltages Vcc and Vss at nodes 203 and 205. Nodes 203 and 205 connect to source/drain terminals of transistor 202 and 204, respectively. Driver 200 also includes a first node 210, a second node 211 and a third node 220. First node 210 and second node 211 connect to internal circuitry 213 of IC 120. For simplicity and to concentrate on the invention, detail of internal circuitry 213 connected to nodes 210 and 211 is not shown. Driver 200 connects to pin 120-0 at second node 220. From the schematic diagram of FIG. 2, node 122-0 can charge to Vcc or Vss via two paths 207 or 209. Path 207 includes pin 122-0, node 220, transistor 202 and node 203 and is controlled by node 210. Path 209 includes pin 122-0, node 220, transistor 204 and node 205 and is controlled by node 211. Similarly, pin 120-1 also connects to a buffer or driver such as driver 200 and internal circuitry 213 in the same fashion as pin 122-0.

Furthermore, for simplicity, FIG. 2 only shows connections of pins 122-0 and 122-1 to other circuit elements, such as driver 200. Other pins 122 3-N of IC 120 have similar connection. Moreover, driver 200 connected to pin 122-0 or 122-1 can differ in other embodiments of IC 120. Construction of driver 200 is shown for the purpose of illustrating the invention. Other drivers or variations of driver 200 can be substituted. Therefore the invention is not limited to schematic diagram shown is FIG. 2.

Leakage test of IC 120 shown in FIGS. 1 and 2 can be performed in different ways with Boundary Scan according to the invention. In one embodiment, the test includes a Pin to Vcc or Pin to Vss test. In another embodiment, the test includes a Pin to Pin test. Both tests have a common characteristic, which is testing pins 122 0-N by sampling the RC time constant of the leakage current at pins 122 0-N with Boundary Scan.

Throughout the description of the invention, numerical values of Vss and Vcc are assumed to be 0 volts and 2 volts, respectively. These values are used only for the purpose of simplicity to describe the invention. These numerical values represent logic low and logic high and are relative to each other. Therefore, values other than 0 or 2 volts can also be used to indicate logic low (low) and logic high (high). Vss and Vcc also represent logic low and logic high.

In addition, in the description of the invention, a state refers to a logic low or logic high. Therefore, a state also refers to voltage value of 0 volts or 2 volts, or at other predetermined voltage values, typically 1.5 Volts for logic high and 0.5 Volts for logic low. A state also refers to Vss or Vcc. When a terminal or pin is said to be at a certain state, it means that the pin is at a logic low or logic high. When two supply voltages are said to have opposite states, it means that one of the voltages is at Vss (or 0 volts) and the other is at Vcc (or 2 volts). It also means that one of the voltages is low and the other is high. Similarly, when two terminals or pins are at opposite states, it means that one pin is at logic low (or Vss), and the other pin is at logic high (or Vcc)

Pin to Vcc or Pin to Vss Test

In general, at the beginning of the test, a pin is tri-stated or floated. The pin is subsequently driven to a known state with a Boundary Scan pattern (Vss, Vcc, low, or high) for a first predetermined time. After the pin reaches the known state, it is allowed to float or to be unconnected. If the pin has the defect being tested for, it leaks and eventually changes from one state to the other state. At a second predetermined time, the pin is sampled with Boundary Scan. In other words, the voltage value of the pin is measured by internal circuitry of the IC to determine its state at the second predetermined time. Based on the state (measured voltage) of the pin, a pass fail result is determined. In the following detailed description, for simplicity, only leakage testing of pin 122-0 is described: other pins (122 1-N) are tested in the same manner. In one embodiment, only input output pins of IC 120 are tested with Boundary Scan.

In a Pin to Vcc test, referring to FIG. 2, pin 122-0 is selected. First tester 110 charges or applies supply voltage Vss to pin 122-0 via Boundary Scan pins 122a–122n for first predetermined time, which is the time required for pin 122-0 to reach Vss. In other words, tester 110 causes driver 200 to charge or drive pin 122-0 for a time period until it reaches Vss or a logic low state. Throughout the description of the invention, when tester 110 charges or drives a pin of IC 120 to a given state, it does not necessarily directly charge or drive the pin. Instead, tester 110 indirectly causes IC 120 to charge or drive the pin.

When the voltage at pin 122-0 reaches Vss or when pin 122-0 reaches the low state, tester 110 stops driving pin 122-0 and lets it float. Pin 122-0 starts to charge toward Vcc via leakage on path 207 or elsewhere in the circuit. At a second predetermined time, tester 110 samples the state of pin 122-0. In one embodiment, sampling the state of pin 122-0 includes measuring a voltage value of pin 122-0. Based on the state of pin 122-0 at the second predetermined time, its quality is determined. A good pin will still be in a low state while a bad pin will have enough leakage that it will switch to a high state. Pin to Vcc test is further understood with a description of FIG. 3.

Figure 3:
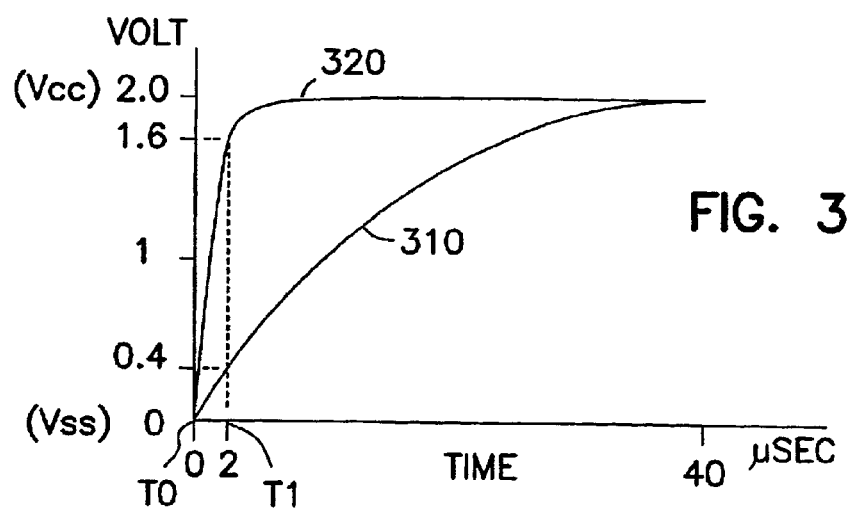
FIG. 3 is a graph showing voltage vs. time curves of a Pin leaking to Vcc according to the invention.

FIG. 3 is a graph showing voltage vs time curves of a Pin to Vcc leakage test according to the invention. Curve 310 is a voltage vs time curve of pin 122-0 in a passing test example. Curve 320 is a voltage vs time curve of pin 122-0 in a failing test example. During a first predetermined time, before time T0, tester 100 drives pin 122-0 to Vss with Boundary Scan via Boundary Scan pin 122a–122n. At time T0, at about 0 microsecond in the graph, pin 122-0 reaches Vss or a low state (about 0 volts). After reaching Vss, pin 122-0 is allowed to float. Pin 122-0 starts to charge toward Vcc. At a second predetermined time, time T1, tester 110 samples a voltage value of pin 122-0 with Boundary Scan. The second predetermined time is the amount of time allowed for pin 122-0 to leak (charge or discharge) but still retaining a voltage indicating the same state as it was before the leak (before the charge or discharge). In FIG. 3, the second predetermined time is about 2 microseconds, or the time between T0 and from time T1. In other embodiments, the second predetermined time (T1) varies depending on the values of the voltages used for a low or a high, the capacitance of the pin, and the allowable amount of leakage on a good pin.

On curve 310 of FIG. 3, at time T1, the voltage value is at about 0.4 volt, which is relatively closer to 0 volts (Vss) than 2.0 volts (Vcc). This indicates that pin 122-0 has a small leakage current because its voltage still remains close to the original driven value of Vss or low state. In other words, since it leaks current slowly, pin 122-0 does not quickly change state from Vss (low) to Vcc (high). In this case, based on the measured voltage value at time T1, pin 122-0 still retains its state, thus it is a good pin.

The RC time constant curve 310 shown in FIG. 3 are used only for the purpose of demonstrating how pin 122-0 charges or discharges after it is floated. The charge or discharge voltage of pin 122-0 at certain time, such as time T1, is measured by internally circuitry of IC 120. The measured voltage is used to determine the state of the pin 122-0 at time T1. The state at time T1 is used to determined the condition or test result of the pin.

In another example shown by curve 320, the voltage value of pin 122-0 at time T1 is about 1.6 volts. This indicates that pin 122-0 has a large leakage current because it does not remain close to the original value of 0 volts (Vss) before the leak. In other words, since it leaks current quickly, pin 122-0 quickly changes state from Vss (low) to Vcc (high). In this case, measured voltage value at time T1 indicates that pin 122-0 changes its state from low to high, thus it is a bad pin.

In a Pin to Vss test, the procedure is the same as in the case for Pin to Vcc test. In this case, however, pin 122-0 is charged or driven to Vcc instead of Vss.

Figure 4:
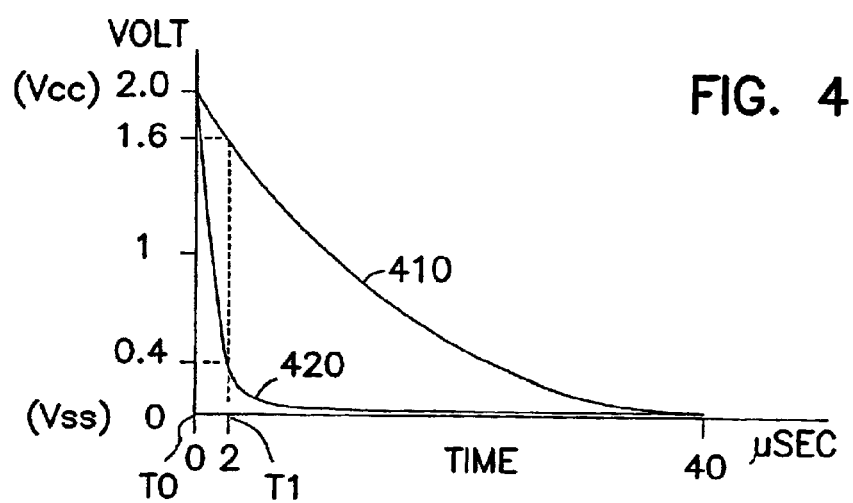
FIG. 4 is a graph showing voltage vs. time curves of a Pin leaking to Vss according to the invention.

FIG. 4 is a graph showing voltage vs time curves of a Pin to Vss leakage test according to the invention. Curve 410 is a voltage vs time curves pin 122-0 of a passing test example. Curve 420 is a voltage vs time curves of pin 122-0 of a failing test example. In FIG. 4, during a first predetermined time, before time T0, tester 100 drives pin 122-0 with Boundary Scan via Boundary Scan pin 122a–122n. At time T0 pin 122-0 reaches Vcc or a high state (about 2 volts). After reaching Vcc, pin 122-0 is allowed to float. Pin 122-0 starts to discharge toward Vss via leakage on path 209 or elsewhere in the circuit. At a second predetermined time, time T1, tester 110 samples a voltage value of pin 122-0. The second predetermined time is the amount of time allowed for pin 122-0 to leak (charge or discharge) but still retaining a voltage indicating the same state as it was before the leak (before the charge or discharge). In FIG. 4, the second predetermined time is about 2 microseconds, or the time between T0 and from time T1. In other embodiments, the second predetermined time varies depending on the values of voltages used for a low or a high, the capacitance of the pin, and the allowable amount of leakage on a good pin.

On curve 410 of FIG. 4, at time T1, the voltage value is at about 1.6 volts at time T1, which is relatively closer to 2.0 volts (Vcc) than 0 volts (Vss). This indicates that pin 122-0 has a small leakage current because its voltage retains close to the original driven value of Vcc (high) before the leak. In other words, since it leaks current slowly, pin 122-0 does not quickly change state from Vcc (high) to Vss (low). In this case, based on the measured voltage value at time T1, pin 122-0 retains its state, thus it is a good pin.

In another example shown by curve 420, the voltage value of pin 122-0 at time T1 is about 0.4 volts. This indicates that pin 122-0 has a large leakage current because it does not remain close to the original value of 2 volts (Vcc). In other words, since it leaks current quickly, pin 122-0 quickly changes state from Vcc to Vss. In this case, the measured voltage value at time T1 indicates that pin 122-0 is a bad pin.

Pin to Pin test

Pin to Pin leakage test is performed in a similar fashion as Pin to Vcc/Vss leakage test. In general, two pins are charged or driven to opposite states (Vss and Vcc or low and high) for a first predetermined time with Boundary Scan. After the pins reach the opposite states, they are allowed to float or to be unconnected. The pins leak toward each other and if neither has significant leakage to Vcc or Vss eventually establish a steady state of approximately one-half the value of Vcc (Vcc/2). At a second predetermined time, the state each of the pins is sampled using Boundary Scan. Based on the state of each of the pins, a pass/fail result is determined. In the following detailed description, for simplicity, only leakage testing of pins 122-0 and 122-1 are described; other pins (122 2-N) are tested in the same manner.

Referring to FIG. 2, in a Pin to Pin test, tester 110 charges or drives pin 122-0 to a high state and pin 122-1 to a low state with Boundary Scan via Boundary Scan pins 122a–122n for first predetermined time. In other words, pin 122-0 is driven to Vcc and pin 122-1 is driven to Vss. It is understood that pin 122-0 can be driven to Vss instead of Vcc; and pin 122-1 can be driven to Vcc instead of Vss. The selection of which voltage or state applied to each pin is arbitrary as long as the pins are applied with opposite voltages or states.

When pins 122-0 and 122-1 reach opposite states of Vcc and Vss, they are allowed to float. Pins 122-0 and 122-1 start to leak toward Vcc/2. At a second predetermined time, tester 110 samples the state each of the pins using Boundary Scan. In one embodiment, sampling the state of each of the pins 122-0 and 122-1 includes measuring voltage value of each of the pins 122-0 and 122-1. Based on the states or the measured voltage values of pins 122-0 and 122-1. the quality or pass/fail result of pins 122-0 122-1 are determined. Pin to Pin leakage test is further understood with a description of FIG. 5.

Figure 5:
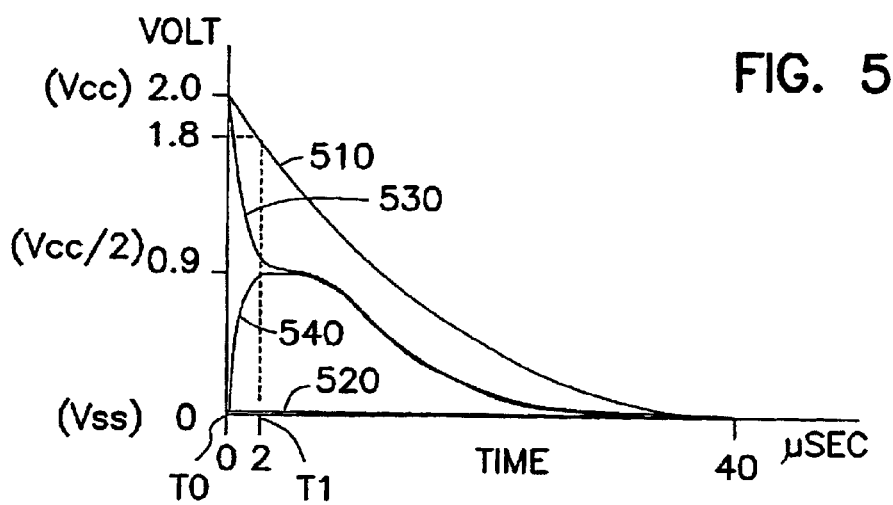
FIG. 5 is a graph showing voltage versus time curves of a Pin leaking to another Pin according to the invention.

FIG. 5 is a graph showing a voltage versus time curves of a Pin to Pin leakage test according to the invention. Curve 510 is a voltage vs. time curve of pin 122-0 for the case where the Pin to Pin leakage is acceptable. Similarly, curve 520 is a voltage vs. time curve of pin 122-1 for the acceptable leakage case. Curve 530 is a voltage vs. time curve of pin 122-0 for the case where there is unacceptable Pin to Pin leakage. Finally, curve 540 is a voltage vs. time curve of pin 122-1 for the case where there is unacceptable Pin to Pin leakage. In FIG. 5, during a first predetermined time, before time T0, tester 100 drives pins 122-0 and 122-1 with Boundary Scan. At time T0, at 0 microseconds in the graph, pin 122-0 reaches Vcc (about 2 volts), and pin 122-1 reaches Vss (about 0 volts). After reaching Vcc and Vss, pins 122-0 and 122-1 are allowed to float.

At a predetermined time, time T1, the voltage value of each of the pins 122-0 and 122-1 is measured by internal circuitry of IC 120. The second predetermined time is the amount of time allowed for each of the pins 122-0 and 122-1 to leak (charge or discharge) but still retain a voltage indicating the same state as it was before the leakage waiting time (before the charge or discharge). In FIG. 5, the second predetermined time is about 2 microseconds, or the time between T0 and T1. In other embodiments, the second predetermined time varies depending on the values of voltages used for a low or a high the capacitance of the pins, and the allowable amount of leakage on a good pin. Time T1 is shown in the graph at about 2 microseconds.

On curve 510, at time T1, the voltage value of pin 122-0 is at about 1.8 Volts. On curve 520, at time T1, the voltage value of pin 122-1 is at about 0 Volts. Neither pin has suffered from significant Pin to Pin leakage, so this is a passing test case with both pins slowly leaking towards Vss at an acceptable rate. Based on the measured voltage value at time T1 of each of the pins 122-0 and 122-1, the pass/fail result of pins 122-0 and 122-1 are determined. At time T1, the voltage value of pin 122-0 on curve 530 and pin 122-1 on curve 540 is about 0.9 Volts. In this case the leakage between the pins has pulled them both to an intermediate voltage. With the same voltage, both pins will be interpreted as having the same state, hence at least one of the pins has switched state indicating a pin to pin leakage failure. Thus based on the measured voltage value at time T1 of each of the pins 122-0 and 122-1, the pass/fail result of pins 122-0 and 122-1 are determined.

Other variations of Pin to Pin leakage test can also be implemented in a similar fashion as the Pin to Pin leakage test described above. For example, in one variation of the Pin to Pin test, pins 122-0 and 122-1 are driven to opposite states in the same manner as described above. However, in this test, only one of the pins, for example pin 122-0, is stopped driven when it reaches a predetermined state. Pin 122-0 is then allowed to float while pin 122-1 is still driven. In this case, since pin 122-1 is still driven, only pin 122-0 charges to Vcc instead of Vcc/2, if it were initially driven to Vss; or pin 122-0 discharges to Vss instead of Vcc/2 if it were driven to initially Vcc. After this step, the method is identical to the Pin to Vcc or Pin to Vss leakage test.

Figure 6:
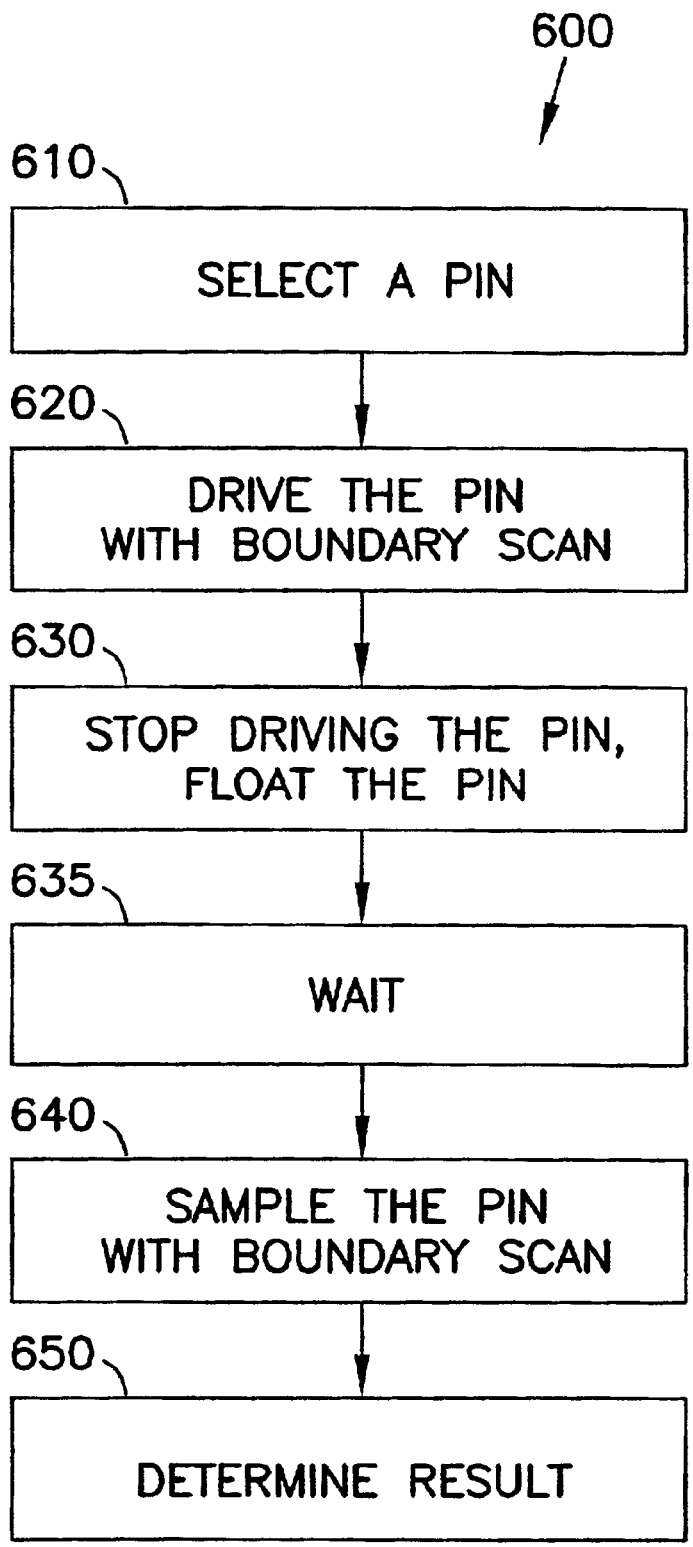
FIG. 6 is a flow chart illustrating one embodiment of a method of leakage testing according to the invention.

FIG. 6 is a flow chart illustrating one embodiment of a method of a leakage test according to the invention. Method 600 provides a leakage test of an IC by sampling the RC time constant of leakage current with Boundary Scan. In method 600 a pin is tested individually.

In step 610, one or more pins of an IC are selected.

In step 620, the pin is driven to a predetermined supply voltage or state with Boundary Scan. The predetermined supply voltage can be Vss or Vcc. These values refer to logic low or logic high state. Thus, driving the pin to Vss or Vcc also means applying a low or a high to the pin. The pin is driven for a first predetermined time until it reaches Vss or Vcc.

In step 630, after the pin reaches the predetermined state (low or Vss, high or Vcc), driving is stopped and the pin is allowed to float. The pin begins charging to Vcc if it were driven to Vss or discharging to Vss if it were driven to Vcc.

In step 635, the tester waits while leakage is allowed to charge or discharge the pin under test.

In step 640, after the pin charges or discharges, at a second predetermined time, the state of the pin is sampled with Boundary Scan. In one embodiment, the sampling includes measuring a voltage value of the pin. The state or voltage value of the pin at the second predetermined time indicates the speed at which the pin charges or discharges. It also indicates how the pin retains or changes its state.

In step 650, the measured voltage value is analyzed to determine the pass/fail test result of the pin or the quality of the IC. If the pin changes to different state it means that the pin has a large leakage current, thus, the result is a failure. If the pin retains its state, it means that the pin has a small leakage current, thus, the result is a pass.

Figure 7:
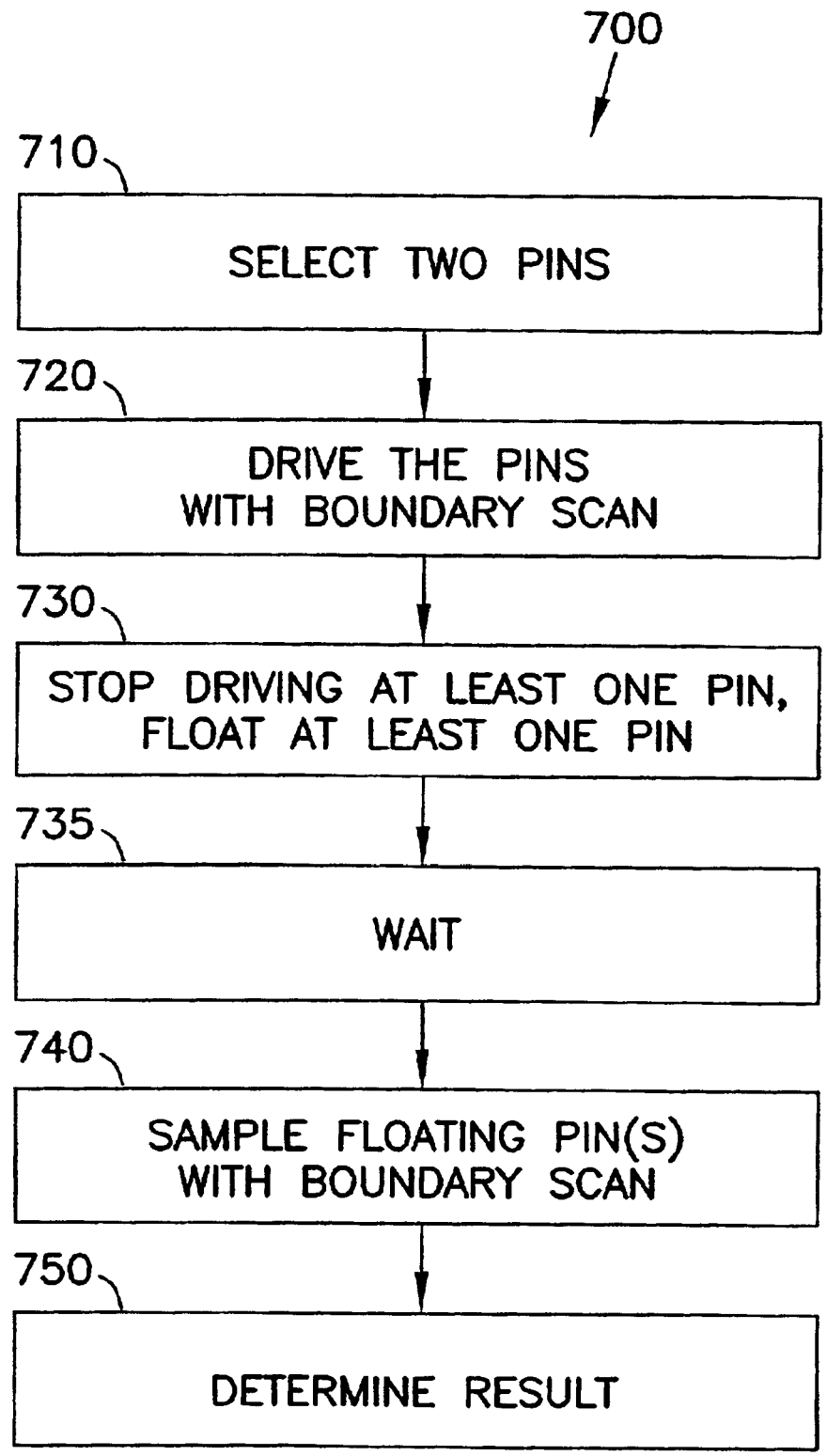
FIG. 7 is a flow chart illustrating another embodiment of a method of leakage testing according to the invention.

FIG. 7 is a flow chart illustrating another method of a leakage test according to one embodiment of the invention. Method 700 provides a leakage test of an IC by sampling the RC time constant of leakage current with Boundary Scan. Method 700 tests two pins.

Step 710 selects two pins of an IC.

Step 720 drives the pins to predetermined opposite states with Boundary Scan. The predetermined states can be Vss and Vcc. In one embodiment, Vss is about 0 volts, and Vcc is about 2 volts. These values also refer to a logic low state and a logic high state. Each of the pins is driven for a first predetermined time until they reach the opposite states.

In step 730, after the pin reaches Vss or Vcc, driving is stopped and the pins are allowed to float. The pins begin charging towards one another. In one embodiment, the driving is stopped at only one of the pins, and that pin is allowed to float while the other pin is still driven. In that case, the stopped driven pin charges or discharges towards Vcc or Vss.

In step 735, the tester waits while leakage between the pins redistributes their charge and causes the voltages of the pins to move towards each other.

In step 740, after the pins charge or discharge to the steady state, at a second predetermined time, a voltage value of each of the pins is measured or sampled with Boundary Scan. The voltage value of each of the pins indicates the speed at which each of the pins charges or discharges. It also indicates how each of the pins changes to the steady state. In one embodiment, if driving is stopped at only one pin, then only one pin is sampled at the second predetermined time.

In step 750, the measured voltage value is analyzed to determine the pass/fail test result of the pin or the quality of the IC. If the pin quickly reaches the steady state, it means that the pin has a large leakage current, thus, the result is a failure. If the pin slowly reaches the steady state, it means that the pin has a small leakage current, thus, the result is a pass.

Figure 8:
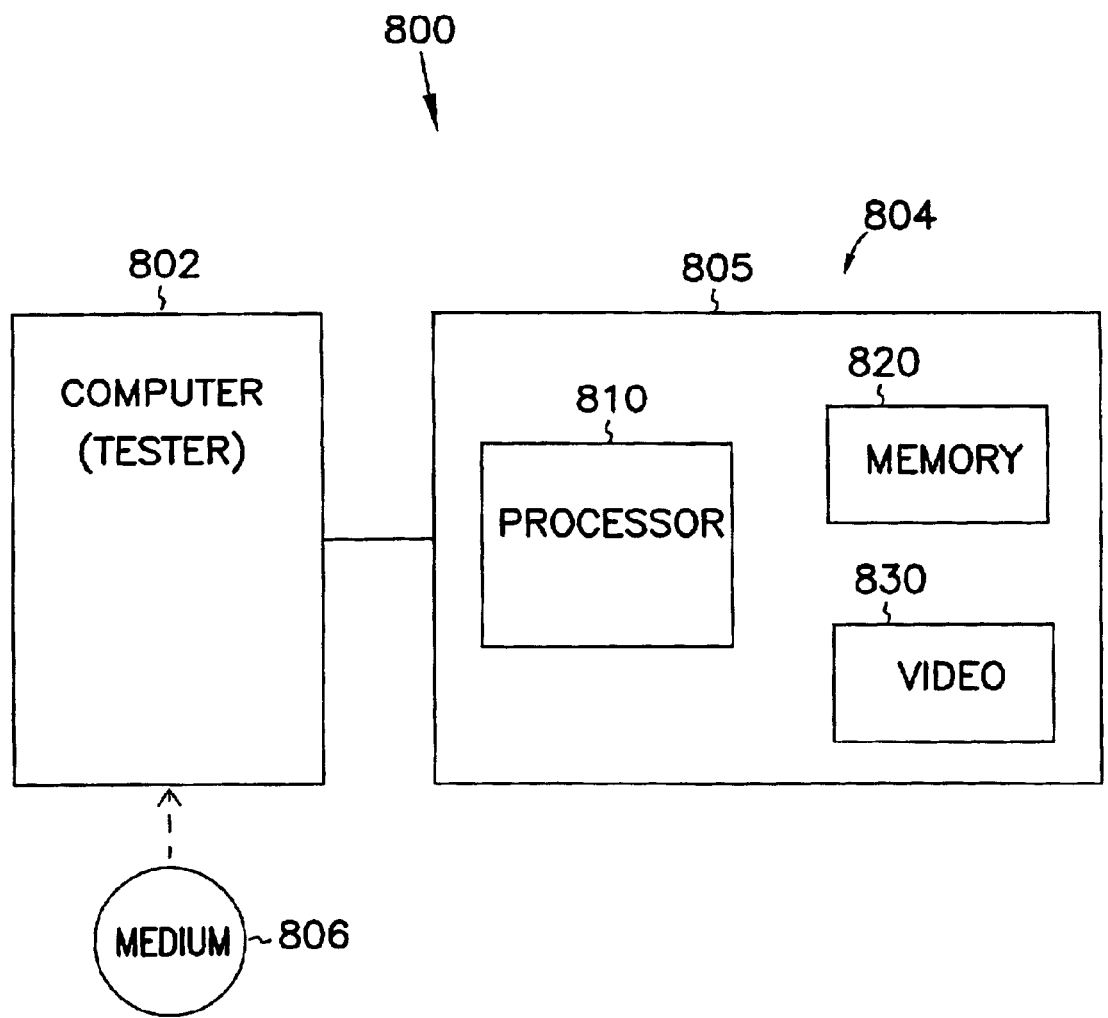
FIG. 8 is a block diagram of a test system according to the invention (show the memory connected to the back of the CPU and the tester connected to the front of the CPU)

FIG. 8 is a block diagram of a test system according to the invention. Test system 800 includes a tester 802, which can be a computer. Computer 802 connects to a circuit module 804, which includes circuit board 805 and a plurality of ICs 810, 820 and 830 located on board 805. ICs 810, 820 and 830 can be different types of devices and perform different functions. For example, IC 810 can be a processor; IC 820 can be a memory device; and IC 830 video controller. In addition, each of the ICs 810, 820 and 830 also includes a plurality of pins such as pins 122-0 to 122-1 and 122a–122n of IC 120 of FIG. 1.

In addition, the test system also includes a machine-readable medium or computer-readable medium 806, which has instructions stored thereon for causing computer 802 to perform a test such as Pin to Vcc, Pin to Vss, or Pin to Pin leakage tests described above. Computer-readable medium 806 may be a physically fixed medium within computer 802, such as a fixed disk drive, flash memory, programmable read-only memory, random-access memory or other fixed storage medium known in the art. Computer-readable medium 806 further may be removable from computer 802, such as a floppy disk, CD-ROM, tape cartridge, or other removable storage medium known in the art.

In the case of a system level test, all of the device pins attached to a single net or wire are tested simultaneously. In this case the test proceeds by tri-stating all of the pins attached to a single net in the system except for one. This one driver on one of the ICs 810, 820, or 830 then drives the net to either Vcc or Vss. This driver is then tri-stated, and after waiting a time T1 for leakage to charge or discharge the net, the net is sampled by one of the receivers, possibly, but not necessarily on the same IC as the driver. If the net has changed state, then there is a leakage failure on at least one of the pins attached to that net.

According to the teaching of the invention, leakage test as described above can be applied to each of the ICs 810, 820 and 830 even if the ICs are different devices and perform different functions. In one embodiment, a Pin to Vcc, Pin to Vss, or Pin to Pin leakage test can be used to test at least one pin of processor 810, memory device 820 or video controller 830.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of testing an integrated circuit (IC), the method comprising:

driving a terminal on the IC to a state;

stopping the driving of the terminal;

floating the terminal for a predetermined time;

sampling a state of the terminal after the predetermined time; and determining a state of the terminal after the predetermined time, wherein the method is performed with Boundary Scan.

2. The method of claim 1 further comprising:
    determining quality of the IC based on the state of the terminal after the predetermined time.

3. The method of claim 1, wherein driving includes applying a logic low to the terminal.

4. The method of claim 1, wherein driving includes applying a logic high to the terminal.

5. The method of claim 1, wherein determining includes measuring a voltage of the terminal after the predetermined time.

6. A method of testing comprising:
    charging a pin on an integrated circuit (IC) until it reaches a known state;
    stopping the charging of the pin;
    floating the pin for a predetermined time: sampling a slate of the pin after the predetermined time; and
    determining a test result of the pin based on the state of the pin after the predetermined time, wherein the method is performed with Boundary Scan.

7. The method of claim 6, wherein charging includes driving the pin to a logic low.

8. The method of claim 6, wherein charging includes driving the pin to a logic high.

9. The method of claim 6, wherein sampling includes determining if the pin changes state after the predetermined time.

10. A machine-readable medium having instructions stored thereon to cause a tester to perform a method, the method comprising:
    driving a terminal on an integrated circuit (IC) to a state;
    stopping the driving of the terminal;
    floating the terminal for a predetermined time;
    sampling a state of the terminal after the predetermined time; and
    determining a state of the terminal after the predetermined time, wherein the method is performed with Boundary Scan.

11. The method of claim 10, wherein driving includes applying a logic low to the terminal.

12. The method of claim 10, wherein driving includes applying a logic high to the terminal.

13. The method of claim 10, wherein driving includes applying a voltage to the terminal.

14. The method of claim 10, wherein determining includes measuring a voltage at the terminal after the predetermined time.

15. A machine-readable medium having instructions stored thereon to cause a tester to perform a method, the method comprising:
    charging a pin on an integrated circuit until it reaches a known state;
    stopping the charging of the pin;
    floating the pin for a predetermined time;
    sampling a state of the pin after the predetermined time; and
    determining a test result of the pin based on the state of the pin after the predetermined time, wherein the method is performed with Boundary Scan.

16. The method of claim 15, wherein charging includes driving the pin to a logic low.

17. The method of claim 15, wherein charging includes driving the pin to a logic high.

18. The method of claim 15, wherein sampling includes determining if the pin changes state after the predetermined time.

19. A method comprising:
    driving a terminal on an integrated circuit to a state;
    stopping the driving of the terminal;
    floating the terminal for a predetermined time; and
    determining a state of the terminal after the predetermined time, wherein the method is performed with Boundary Scan.

20. The method of claim 19 further comprising:
    determining quality of the integrated circuit based on the state of the terminal after the predetermined time.

21. The method of claim 19, wherein driving includes applying a logic low to the terminal.

22. The method of claim 19, wherein driving includes applying a logic high to the terminal.

23. The method of claim 19, wherein determining includes measuring a voltage of the terminal after the predetermined time.

24. A machine-readable medium having instructions stored thereon to cause a tester to perform a method, the method comprising:
    driving a terminal on an integrated circuit to a state;
    stopping the driving of the terminal;
    floating the terminal for a predetermined time; and
    determining a state of the terminal after the predetermined time, wherein the method is performed with Boundary Scan.

25. The method of claim 24, wherein driving includes applying a logic low to the terminal.

26. The method of claim 24, wherein driving includes applying a logic high to the terminal.

27. The method of claim 24, wherein driving includes applying a voltage to the terminal.

28. The method of claim 24, wherein determining includes measuring a voltage at the terminal after the predetermined time.

* * * * *

UNITED STATES PATENT AND TRADEMARK OFFICE
CERTIFICATE OF CORRECTION

PATENT NO. : 6,777,970 B2
DATED : August 17, 2004
INVENTOR(S) : Arabi et al.

It is certified that error appears in the above-identified patent and that said Letters Patent is hereby corrected as shown below:

Column 9,
Line 16, delete "slate" and insert -- state --, therefor.

Signed and Sealed this

First Day of February, 2005

JON W. DUDAS
*Director of the United States Patent and Trademark Office*